United States Patent [19]

Masaki et al.

[11] Patent Number: 4,654,471
[45] Date of Patent: Mar. 31, 1987

[54] ELECTRONIC SWITCH

[75] Inventors: Akio Masaki, Shino; Yoshio Moriyasu, Omihachiman; Kenji Ueda; Kiyoshi Miyamoto, both of Otsu, all of Japan

[73] Assignee: Omron Tateisi Electronics Co., Kyoto, Japan

[21] Appl. No.: 727,050

[22] Filed: Apr. 25, 1985

[30] Foreign Application Priority Data

Apr. 25, 1984 [JP] Japan .................................. 59-62022

[51] Int. Cl.$^4$ .............................................. H05K 5/00
[52] U.S. Cl. .................................... 174/50; 174/52 R; 361/179
[58] Field of Search .................... 174/50, 52 R; 328/5; 361/179, 180, 181; 307/116; 324/234–238, 156; 340/693; 200/DIG. 1

[56] References Cited
U.S. PATENT DOCUMENTS 4,314,310  2/1982  Schmidt ......................... 174/52 R X
4,552,987  11/1985  Stebegg et al. .................... 174/52 R Primary Examiner—Arthur T. Grimley
Assistant Examiner—D. A. Tone
Attorney, Agent, or Firm—Schwartz, Jeffery, Schwaab, Mack, Blumenthal & Evans

[57] ABSTRACT

An electronic switch includes a detector head in the form of a rectangular parallelepiped having a detecting surface and connecting members disposed on a corner thereof including a surface opposite to the detecting surface, the connecting members being identical in shape when the detecting surface is oriented in either a forward or lateral direction, the connecting members being symmetrically arranged with respect to an edge of the detector head, a head joint having an end to which the detector head is connectable by the connecting members and also having a rotatable annular connector on an opposite end thereof, and a switch box having engagement means for slidable engagement with the annular connector of the head joint so that the head joint can be rotatably mounted on the switch box. The detecting surface can be oriented in all of lateral directions by rotating the head joint. Since the head joint can be rotated without detaching the detector head, the electronic switch can easily detect desired objects which may be differently positioned.

2 Claims, 5 Drawing Figures

ELECTRONIC SWITCH

BACKGROUND OF THE INVENTION

The present invention relates to an electronic switch such as a proximity switch or a photoelectric switch, composed of a detector head and a switch box, and more particularly to an electronic switch in which the detector head can be attached in various desired directions.

Conventional proximity switches or photoelectric switches are composed of a detector head and a switch box, the detector head having a detecting surface on its front or side. Since the detector head is attached in one direction only, the direction of the detecting surface cannot be changed freely. Where the detecting surface is on the side of the detector head, however, it is frequently necessary to vary the detecting direction. Therefore, a rotatable attachment should be used to attach the switch casing to an attachment base.

One prior rotatable electronic switch has an attachment comprising two or four members. When the detecting direction is to be changed by rotating the switch casing, the attachment members are required to be disassembled, combined again in a desired direction, and attached to the attachment base. In such a reassembling process, the attachment, members are liable to scatter around, and it is tedious and time-consuming to change the detecting direction. The conventional electronic switch attachment is also disadvantageous in that the detecting surface cannot be switched between the side and front of the detector head.

SUMMARY OF THE INVENTION

In view of the aforesaid problems with the prior electronic switch, it is an object of the present invention to provide an electronic switch having a detecting surface switchable between the front and side of the switch casing, which is rotatable to orient the detecting surface in any desired direction.

According to the present invention, there is provided an electronic switch comprising a detector head in the form of a rectangular parallelepiped having a detecting surface and connecting members disposed on a corner thereof including a surface opposite to the detecting surface, the connecting members being identical in shape when the detecting surface is oriented in either a forward or lateral direction, the connecting members being symmetrically arranged with respect to an edge of the detector head; a head joint having an end to which the detector head is connectable by the connecting members and also having a rotatable annular connector on an opposite end thereof; and a switch box having engagement means for slidable engagement with the annular connector of the head joint so that the head joint can be rotatably mounted on the switch box.

With this arrangement, the detector head can be attached to the head joint with the detecting surface positioned in a forward or lateral direction. The head joint is rotatably coupled to the switch box by the engagement means thereof. By connecting the detector head differently to the head joint, the detecting surface can be directed in either the forward or lateral direction. By rotating the head joint, the detecting surface can be oriented in all of lateral directions. Since the head joint can be rotated without detaching the detector head, the electronic switch can easily detect desired objects which may be differently positioned.

The above and other objects, features and advantages of the present invention will become more apparent from the following description when taken in conjunction with the accompanying drawings in which a preferred embodiment of the present invention is shown by way of illustrative example.

DESCRIPTION OF THE PREFERRED EMBODIMENT

Figure 1:
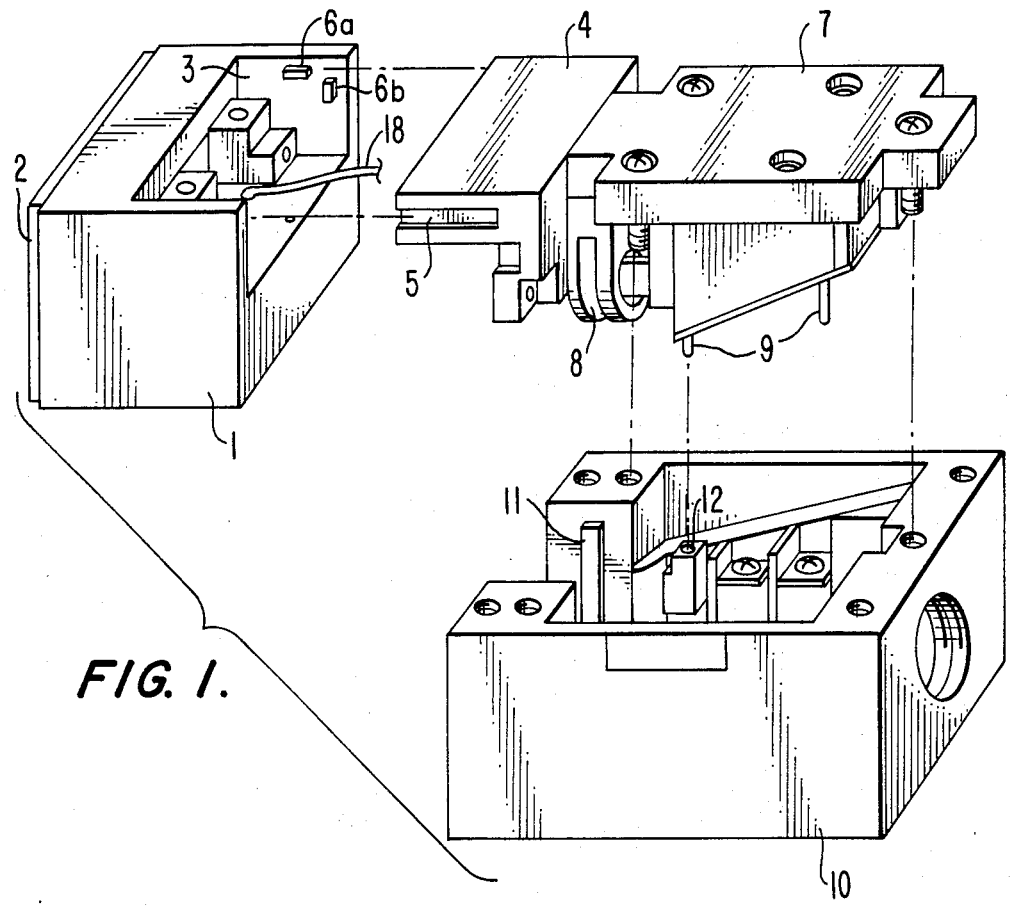
FIG. 1 is an exploded perspective view of an electronic switch according to the present invention.

FIG. 1 shows an electronic switch such as a proximity switch or a photoelectric switch, for example, according to the present invention. The electronic switch includes a detector head 1 substantially in the form of a cube or rectangular parallelepiped having a detecting surface 2 on its front side. The detector head 1 has a rectangular opening 3 defined in a corner thereof which includes a surface opposite to the detecting surface 2. The rectangular opening 3 will be closed by a head joint 4 when the detector head 1 is combined with the head joint 4. The opening 3 is defined partly by inner wall surfaces on which there are provided connecting members comprising projections 6a, 6b each in the form of a rectangular parallelepiped. The projections 6a, 6b extend parallel to two sides or edges of the corner of the detector head 1 for guiding grooves 5 defined in the head joint 4. The projections 6a, 6b are symmetrically arranged with respect to an edge of the detector head 1 so that the projections 6a, 6b are identical in shape as seen from the head joint 4 when the detecting surface 2 is directed in a forward or lateral direction.

The head joint 4 is a connecting component for rotatably connecting the detector head 1 to the switch box 7, the head joint 4 having a groove 8 defined in its side to be inserted in a receptacle 10. The switch box 7 has a switch circuit therein for issuing an output signal dependent on a detected signal from the detector head 1, the switch box 7 having a connector pin 9 projecting downwardly. The switch box 7 and the receptacle 10 jointly constitute a casing of the electronic switch.

The receptacle 10 has linear projections or ridges 11 on confronting inner wall surfaces thereof. Electric power is supplied to the switch box 7 through a connector hole 12 in the receptacle 10. For inserting the switch box 7 combined with the head joint 4 into the receptacle 10, the linear projections 11 are slidably fitted into the groove 8 of the head joint 4. At this time, the pin 9 is inserted into the connector hole 12 of the receptacle 10 to electrically connect the switch circuit in the switch box 7 to the receptacle 10.

Figure 4:
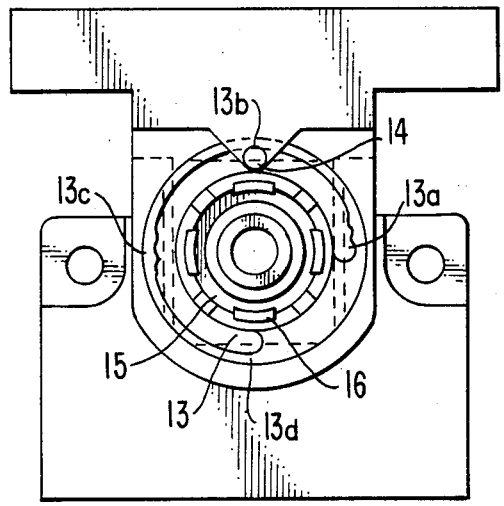
FIG. 4 is a side elevational view of the head joint, showing its coupling surface for being coupled to the switch box.
Figure 5:
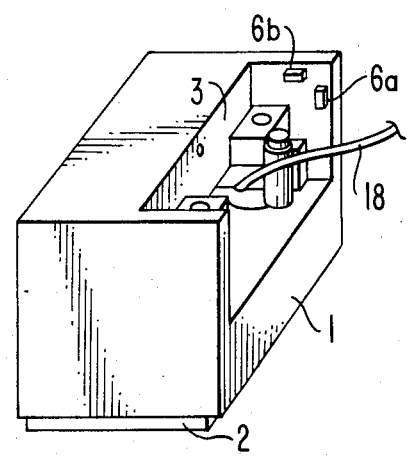
FIG. 5 is a perspective view of the detector head with its detecting surface directed differently
Figure 2:
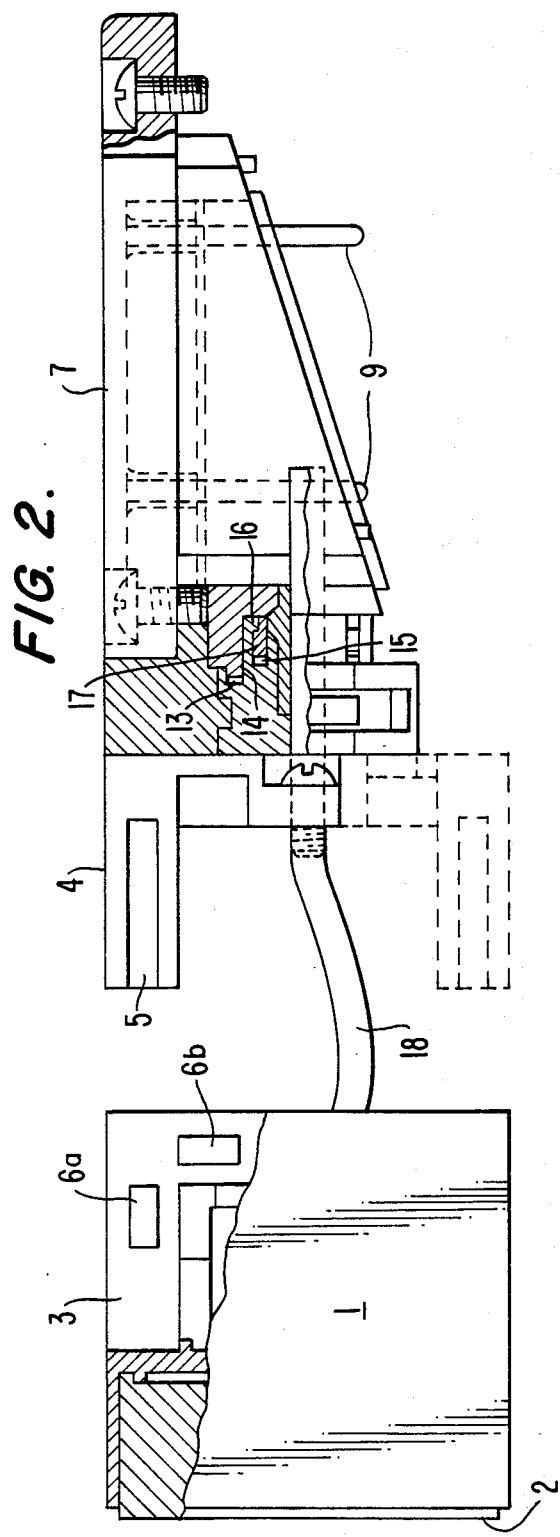
FIG. 2 is an elevational view, partly in cross section, of a detector head, a head joint, and a switch box of the electronic switch.
Figure 3:
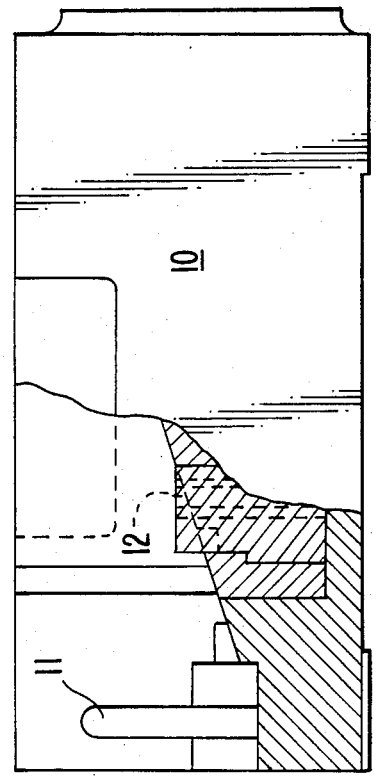
FIG. 3 is an elevational view, partly in cross section, of a receptacle of the electronic switch.

As shown in FIGS. 2 through 4, the head joint 4 has an arcuate slot 13 defined in a surface thereof for connection to the switch box 7. The switch box 7 has a stopper projection 14 engaging in the arcuate slot 13 of the head joint 4 so that the head joint 4 is rotatable in a prescribed angular range with respect to the switch box 7. As illustrated in FIG. 4, the arcuate slot 13 is a 270° arcuate slot including four locking recesses 13a, 13b, 13c, 13d spaced 90° for locking the stopper projection 14. The head joint 4 also has an annular slot 15 disposed radially inwardly of the arcuate slot 13 for holding the head joint 4 and the switch box 7 in engagement with each other. As shown in FIGS. 2 and 4, four snap fingers 16 project from the head joint 4 and radially inwardly over the annular slot 15. The switch box 7 has a tubular projection 17 having a flange for engagement in the annular slot 15.

For assembling the electronic switch, the tubular projection 17 of the switch box 7 is inserted into the annular slot 15 of the head joint 4 beyond the snap fingers 16. Simultaneously, the stopper projection 14 is fitted into the arcuate slot 13. The head joint 4 and the switch box 7 are now joined to each other as illustrated in FIG. 2. As shown in FIG. 1, the projections 6a in the opening 3a in the detector head 1 are fitted into the grooves 5 of the head joint 4, and the head joint 4 and the detector head 1 are fixed to each other by screws with the detecting surface 2 oriented in the forward direction. The linear projections 11 of the receptacle 10 are inserted into the groove 8 of the head joint 4 as shown in FIG. 1 until the switch box 7 is fitted into the receptacle 10, whereupon the electronic switch is assembled.

Since the tubular projection 17 is slidable in the annular slot 15 of the head joint 4, the head joint 4 and the detector head 1 coupled thereto can be rotated to the dotted-line position of FIG. 2. The detector head 1 can be fixed in four 90°-spaced angular positions by the stopper projection 14 selectively engageable in the locking recesses 13a through 13d. The head joint 4 is angularly movable within 270° in order to prevent a lead wire 18 which connects the detector head 1 and the switch box 7 from being twisted off.

The detecting surface 2 can be directed laterally by attaching the detector head 1 differently to the head joint 4. More specifically, the detector head 1 is detached from the head joint 4, and then turned. The grooves 5 of the head joint 4 are fitted over the projections 6b of the detector head 1, which are then inserted. The detector head 1 is then screwed to the head joint 4. Since the detecting surface 2 is now positioned laterally of the detector head 1, the detecting surface 2 can be oriented in four angularly spaced lateral directions by rotating the head joint 4 with respect to the switch casing.

In the illustrated embodiment, the arcuate slot is defined in the head joint, and the stopper projection for insertion in the arcuate slot is disposed on the switch box. Furthermore, the annular slot is defined in the head joint, and the tubular projection for insertion in the annular slot is provided on the switch box. However, these coupling members may be switched around to rotatably connect the head joint and the switch box together.

Although a certain preferred embodiment has been shown and described, it should be understood that many changes and modifications may be made therein without departing from the scope of the appended claims.

What is claimed is:

1. An electronic switch comprising:
   (a) a detector head in the form of a rectangular parallelepiped having a detecting surface and connecting members disposed on a corner thereof including a surface opposite to said detecting surface, said connecting members being symmetrically arranged with respect to an edge of said detector head;
   (b) a head joint having an end to which said detector head is connectable by said connecting members and also having a rotatable annular connector on an opposite end thereof;
   (c) a switch box having engagement means for slidable engagement with said annular connector of said head joint so that said head joint can be rotatably mounted on said switch box; and
   wherein said annular connector comprises an annular slot, said head joint having snap fingers projecting radially inwardly over said annular slot, said engagement means of said switch box comprising an annular projection engageable in said annular slot in engagement with said snap fingers.

2. An electronic switch according to claim 1, wherein said head joint has an annular slot having angularly spaced locking recesses corresponding to detecting directions of said detector head, said switch box having a projection insertable in said arcuate slot and lockable in a selected one of said locking recesses.

* * * * *